United States Patent [19]

Kugimiya et al.

[11] Patent Number: 4,487,635

[45] Date of Patent: Dec. 11, 1984

[54] METHOD OF FABRICATING A MULTI-LAYER TYPE SEMICONDUCTOR DEVICE INCLUDING CRYSTAL GROWTH BY SPIRALLY DIRECTING ENERGY BEAM

[75] Inventors: Koichi Kugimiya, Toyonaka; Shigenobu Akiyama; Genshu Fuse, both of Hirakata, all of Japan

[73] Assignee: Director-General of the Agency of Industrial Science & Technology, Tokyo, Japan

[21] Appl. No.: 466,301

[22] Filed: Feb. 14, 1983

[30] Foreign Application Priority Data

Mar. 25, 1982 [JP] Japan ................................ 57-46288

[51] Int. Cl.³ ...................... H01L 21/263; B05D 3/06
[52] U.S. Cl. .................................. 148/1.5; 29/576 B; 29/576 T; 148/175; 148/187; 357/91; 427/53.1
[58] Field of Search ................... 148/1.5, 187, 175; 29/576 B, 576 T; 427/53.1; 357/91

[56] References Cited

U.S. PATENT DOCUMENTS

| 4,315,130 | 2/1982 | Inagaki et al. | 219/121 L |
| 4,330,363 | 5/1982 | Biegesen | 156/620 |
| 4,372,990 | 2/1983 | Lam | 427/53.1 |
| 4,375,993 | 3/1983 | Mori et al. | 148/1.5 |
| 4,377,031 | 3/1983 | Goto et al. | 29/576 B |
| 4,377,902 | 3/1983 | Shinada et al. | 29/576 B |
| 4,381,201 | 4/1983 | Sakurai | 148/1.5 |
| 4,406,709 | 9/1983 | Celler et al. | 148/1.5 |

FOREIGN PATENT DOCUMENTS 54164059 7/1981 Japan .

OTHER PUBLICATIONS

Biegesen et al., Appl. Phys. Letts. 38 (1981), 150.
Geis et al., J. Vac. Sci. Technol. 16 (1979), 1640.

Primary Examiner—Upendra Roy
Attorney, Agent, or Firm—Stevens, Davis, Miller & Mosher

[57] ABSTRACT

A method of producing a superior semiconductor crystallized layer rapidly on a semiconductor substrate with the surface thereof covered with an insulating film is disclosed. An opening, desirably formed by at least two insulating films, is formed at an intersection of scribe lines of the semiconductor substrate. A polycrystal semiconductor film is formed on the insulating films and the opening, after which an energy beam is irradiated spirally on the polycrystal semiconductor film in such a manner that the beam passes at least one opening during each rotation thereof thereby to transform the polycrystal semiconductor film into a crystallized layer for forming a semiconductor element.

10 Claims, 14 Drawing Figures

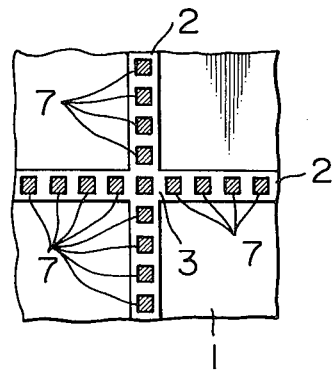
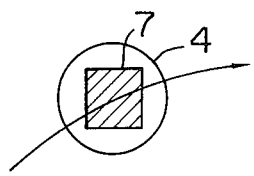
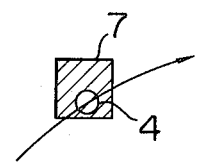
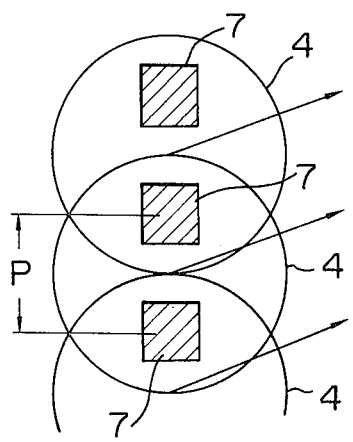
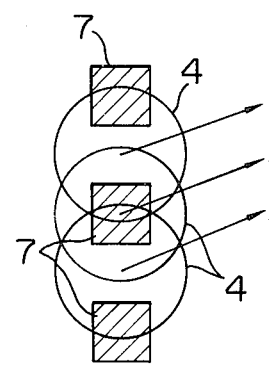

METHOD OF FABRICATING A MULTI-LAYER TYPE SEMICONDUCTOR DEVICE INCLUDING CRYSTAL GROWTH BY SPIRALLY DIRECTING ENERGY BEAM

The present invention relates to a method of fabricating stacking or multilayer-type semiconductor devices generally known as three-dimensional integrated circuits.

For the past several years, a number of suggestions have been made on the method of forming a multilayer-type single crystal for a multilayer-type semiconductor device. These techniques will be described briefly while pointing out the problems thereof below.

In the beam annealing process for a polycrystal island, a polycrystal semiconductor island is formed on an insulating substrate such as $SiO_2$ or $Si_3N_4$ by an ordinary isolation techniques and then a crystal island of a single crystal or large crystal grains is formed by the beam annealing process using a CW, a pulse laser or an electron beam. The disadvantage of this method is that, although a considerably satisfactory single crystal island is obtained, it is impossible to control the crystal orientation on the one hand and the fact that a seed crystal forms in random way on the periphery of the island to produce not a single crystal island but multiple crystal islands of large crystal grains on the other hand, with the result that a large crystal island is incapable of being formed.

The grapho-epitaxy process, on the other hand, is intended to form a single cyrstal film on an insulating amorphous substrate by the beam annealing process. A very fine groove corresponding to the crystal habit or crystal symmetry is formed in advance on the amorphous substrate thereby to control the crystal orientation which cannot be controlled by the preceding method. This method has been applied somewhat successfully to the growth of a single crystal from an aqueous, solution of KCl but has not been satisfactorily employed with semiconductor film such as Si. This technique has not yet reached a stage of practical application as the evaluation of the semiconductor element properties and the analysis of crystal defect, a small-angle grain boundary and a twinning are insufficient. Further, a very high accuracy of forming a groove is required so that even when using the submicron process of the present VLSI technology a number of problems remain to be solved.

According to the bridging epitaxy process or seeded beam annealing process, it is well known that since the crystal growth occurs from an opening of the semiconductor substrate as a seed crystal, the crystal orientation is controlled while at the same time producing a superior crystallinity in some portion as in the above-mentioned beam annealing process for a polycrystal island. In view of the fact that the crystal growth occurs on the periphery of the opening, however, the single crystal grows in random manner in the form of a chrysanthemum, thus making it impossible to obtain a perfect single crystal, and a crystal imperfection or irregularity is likely to occur when the crystal grows on the insulating film around the opening. This technique cannot be used for a large-area application.

Accordingly, it is an object of the present invention to provide a novel method of fabricating a multilayer-type semiconductor device of three-dimensional integrated circuits, in which by application of a method which is considered to be included in the category of the seeded beam annealing process, a crystallized layer is formed on the entire surface of a semiconductor substrate without the disadvantages mentioned above.

Another object of the present invention is to provide a method in which crystallized layers superior in crystallinity are capable of being formed.

A further object of the present invention is to provide a method of forming a crystal with high controllability and efficiency.

According to the present invention, there is provided a method of fabricating a multilayer-type semiconductor device, in which a rectangular opening is arranged at an intersection of scribe lines by an insulating film on a semiconductor substrate carrying a first-layer semiconductor element thereon (SOI), and a polycrystal semiconductor film is formed on the opening and the insulating film. In crystallizing the polycrystal semiconductor film with the substrate of the opening as a seed crystal, an energy beam is irradiated spirally over the entire surface of the semiconductor substrate in such a manner that the energy beam passes the opening at least every rotation thereby to start the growth of a new crystal therefrom. In this manner, substantially the whole surface of the semiconductor substrate is crystallized, after which a second-layer semiconductor element is formed on the resulting crystallized layer by an ordinary fabricating process for semiconductor devices. In the process, the rectangular opening is desirably formed by two layers of insulating films.

The present invention will be apparent from the following detailed description taken in conjunction with the accompanying drawings, in which:

FIG. 3 is a partial schematic diagram showing a multiplicity of openings formed in the scribe line;

FIGS. 4a, 4b and 5a, 5b are diagrams showing the effect of the difference of relative sizes of the beam diameter and the opening;

The present invention will be explained in detail below with reference to an embodiment.

Figure 1:
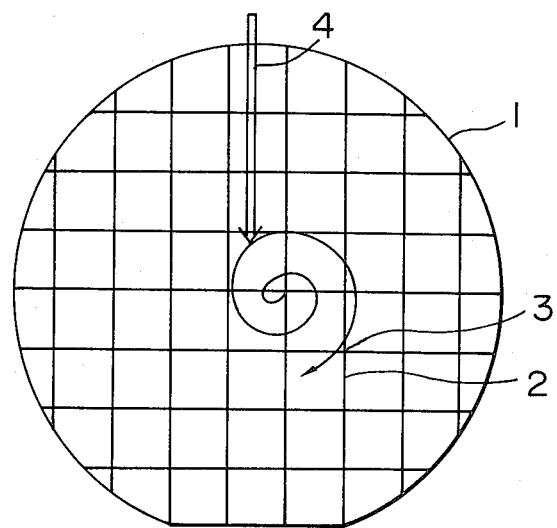
FIG. 1 is a diagram showing the radiation of an energy beam used in the present invention.

According to the present invention, as shown in FIG. 1, an opening, desirably formed by at least two layers of insulating films, is formed at an intersection 3 of scribe lines 2 of a semiconductor substrate (semiconductor wafer), and after forming a polycrystal semiconductor film on this substrate, an energy beam 4 such as laser is irradiated spirally for crystallization as shown in FIG. 1. The crystallization is accelerated by this rectangular opening.

It is a generally-known fact that an attempt to form a rectangular opening in a film by the conventional semiconductor etching technique has difficulty as the corners of the opening are likely to be rounded. In contrast, the use of a plurality of insulating films permits a rectangular opening with sharp corners to be formed accurately.

Figure 2:
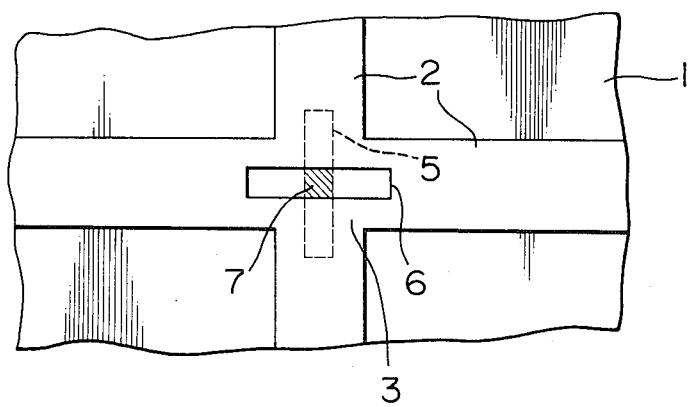
FIG. 2 is a partial schematic view showing a rectangular opening formed in the scribe line according to the present invention.

An example of such a method is shown in FIG. 2. A first insulating film is formed on a substrate 1 that has passed the step of forming a first-layer semiconductor element (which first insulating film may be replaced with equal effect by an insulating film formed at the time of forming the first-layer semiconductor element). A rectangular opening 5 having a vertical longitudinal axis is formed by an ordinary etching method at an intersection of vertical and lateral scribe lines 2. A second insulating film is then formed, and a rectangular opening 6 having a lateral longitudinal axis is formed superimposed on the second insulating film. The common opening 7 of the longitudinal and lateral rectangular openings 5 and 6, which is formed by the linear edges of the openings 5 and 6, has very sharp corners. Another advantage is that since the scribe line 2 does not carry any semiconductor element and is flat, the distortion of lines which otherwise might be caused by the unevenness in the photo-etching process does not occur at all. The small rectangular opening 7 is thus accurately formed and provides a seed crystal opening for single crystallization of the polycrystal semiconductor film formed thereon. At the same time, this construction has the effect of grapho-epitaxy as mentioned above. As a result, in the semiconductor substrate 1 having almost (100) planes, the edges of the insulating film of the rectangular opening formed in parallel or at 45 degrees to the orientation flat have a superior crystallinity, so that a satisfactory crystal growth is considered to continue.

Further, when the scribe line 2, which is otherwise unused, is utilized as a seed crystal, the effective area of the elements is not reduced. Furthermore, although the fact that the opening increases in temperature above 1400° C., though for a short time, and may diffuse impurities, it does not pose any problem in the scribe line.

By irradiating an energy beam of spiral form as in the present invention, it is possible to obtain a single crystal layer of higher quality. By contrast, in the high-speed scanning system of X-Y stage or the like, it is known that the scanning is likely to be unstable and especially at high speed, a zig-zag or vibrations occur, thereby deteriorating the crystal. In the spiral irradiation as used in the present invention, on the other hand, the semiconductor substrate is easily rotated stably at several tens of thousands of r.p.m. on the stage or the like which holds the substrate by vacuum suction, and simultaneously, if the energy beam is moved slowly simply in lateral direction, the spiral irradiation relative to the substrate is accomplished. Also, the rotation of the substrate and the movement of the beam are easily controlled in accurate manner, thus producing a superior crystallized layer as described above. In addition, by changing the angular speed of the beam in inverse proportion to the radius of the substrate, the scanning speed on the substrate is made constant on the one hand and the scanning is made with high efficiency against the circular semiconductor substrate on the other hand.

If the beam passes the opening providing a seed crystal at least once for each rotation, the crystal growth, which may be interrupted, is immediately restarted from the seed crystal. When the present invention is applied to a conventional semiconductor substrate having a diameter of 100 mm$\phi$, therefore, crystallographic direction of grown crystals covering the entire surface thereof may be substantially held in a desired direction, thus minimizing substandard portions. For this purpose, it is desirable to form numerous openings 7 in the scribe line 2 as shown in FIG. 3. By doing so, a recrystallized layer is formed for each chip by the seed crystals. Also, the size of the opening 7 is desirably smaller than the diameter of the energy beam 4 as shown in FIG. 4a, with the result that the grapho-epitaxy effect is obtained as described above. In the case where the relation as shown in FIG. 4b is involved, it is obvious that such an effect is not obtained.

In the case of forming a multiplicity of small openings 7 in proximity to each other, it is most desirable to form the openings 7 substantially equidistantly as shown in FIG. 5 as far as the conventional photo-etching technique is concerned. If an energy beam 4 having a diameter more than twice the pitch p of the openings 7 is irradiated as shown in FIG. 5a, at least one opening 7 is fully contained always in the beam diameter, thus causing the growth from the seed crystal with grapho-epitaxy at that particular portion. Even if the first irradiation is not applied to the whole of the opening 7, the next scanning completely contains the opening 7 in the beam diameter. In general energy beam radiation, one scanning is superimposed on the next scanning, in which case a small superimposition of, say, 10% does not pose any problem. If the diameter of the beam 7 is small as shown in FIG. 5b, however, all the openings may not be contained at least once in the beam diameter unless the beam superimposition is sufficiently large. In the case of FIG. 5b, for instance, the superimposition of about 60% is required, and if the superimposition is about 10%, the grapho-epitaxy effect fails to occur in at least half of the openings. It is therefore desirable to employ, as mentioned above, a relatively large beam diameter of high irradiation efficiency substantially free of the dependency on the scanning superimposition.

If the assembly of an SOI substrate is annealed at temperatures of 700 to 900° C. after forming the polycrystal semiconductor film, the gases absorbed or captured by the film are discharged while at the same time improving the adherence to the substrate by high density. The annealing at temperatures higher than 900° C., however, is not desirable as the impurity profile of the semiconductor element of the first layer formed on the substrate would be changed.

Now, the processes of fabricating multilayer-type semiconductor integrated circuits according to an embodiment of the present invention will be explained with reference to FIGS. 6 and 7.

Figure 6A:
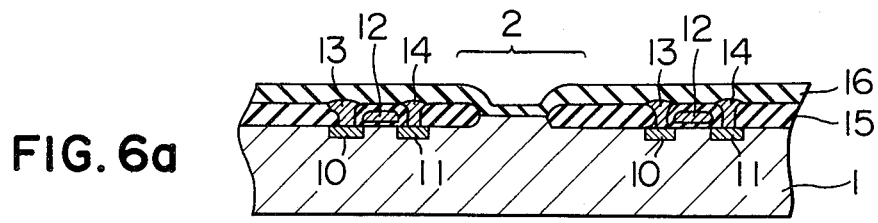
FIGS. 6a to 6e are cross sectional views showing the processes of fabrication of a multilayer-type semiconductor device according to an embodiment of the present invention.
Figure 7:
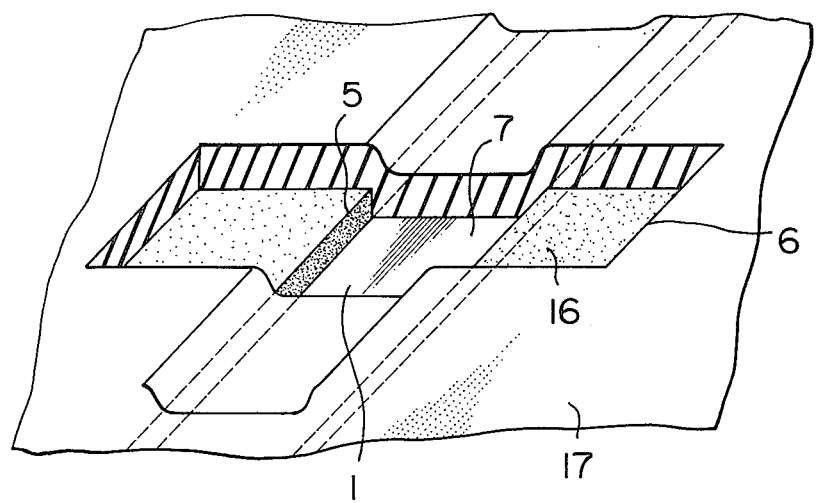
FIG. 7 is a perspective view schematically showing the essential parts of FIG. 6b.

As seen from FIG. 6a, a first-layer semiconductor element (such as a MOS transistor) is formed on the surface of a (100) single-crystal silicon substrate 1. Numerals 10, 11 designate source and drain regions of the MOS transistor, numeral 12 a gate electrode formed through the gate insulating film, numerals 13, 14 source and drain electrodes, and numeral 15 an insulating film. Then a first insulating film 16 made of, say, a plasma silicon nitride film is formed on the whole surface of the substrate 1.

Figure 6B:
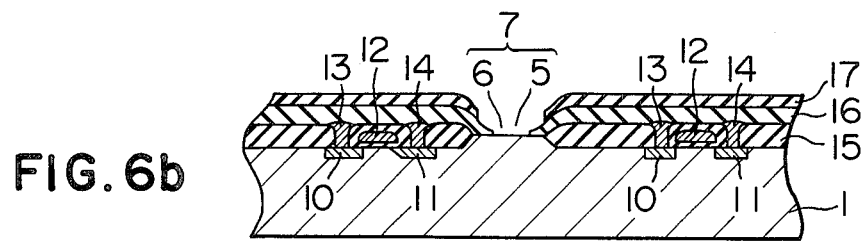

A rectangular opening 5 is formed on the first insulating film 16, and a second-layer insulating film 17 of plasma silicon oxide film is covered on the whole surface. As shown in FIG. 6b, a rectangular opening 6 is formed independently, so that as mentioned above, a rectangular opening 7 with sharp corners is formed on the scribe line 2. Under this condition, the opening 7 is schematically illustrated in FIG. 7.

Figure 6C:
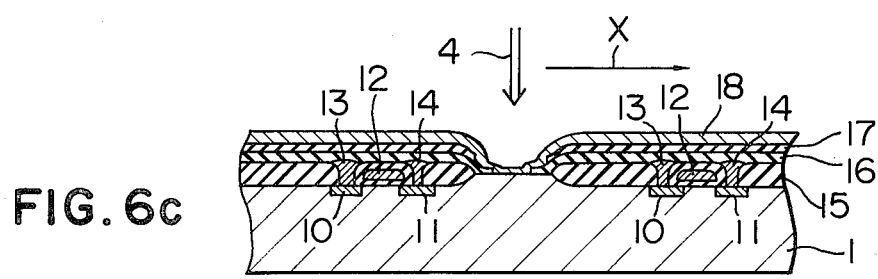

As shown in FIG. 6c, a polycrystal silicon (polysilicon) film 18 is formed to the thickness of 0.3 to 0.7 μm, by either plasma CVD or LPCVD. The substrate is then annealed at 900° C. for 30 minutes and subjected to heat treatment for passivation including the insulating films in the preceding step. This semiconductor substrate is disposed on a vacuum suction stage and while being heated at 450° C., is irradiated with a CW-Ar laser beam of about 80 μm in diameter with the laser output of about 18 W at the scanning speed of 1 m/sec. Each scanning is superimposed on the preceding one by 30%. While rotating the stage at high speed, the laser beam is moved at fixed speed in the direction of an axis as shown by arrow X, so that the semiconductor substrate is irradiated spirally from the substantial center toward the outer periphery thereof. As a result, the polysilicon film 18 changes to single crystal from the center to the outer periphery of the substrate, thus eventually crystallizing the whole surface.

Figure 6D:
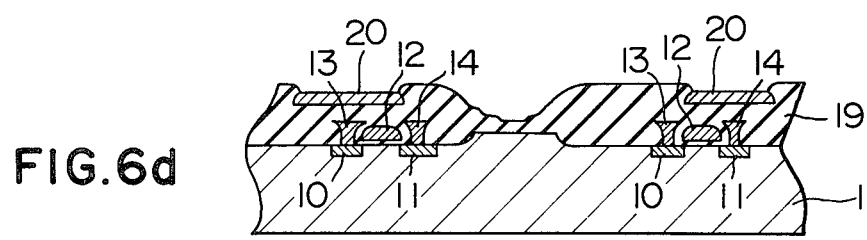

The resulting recrystallized layer provides a substrate for forming a second-layer semiconductor element. This semiconductor element is formed by use of an ordinary semiconductor fabrication technique. As shown in FIG. 6d, part of the recrystallized silicon layer is oxidized so that a silicon island region 20 completely isolated by the insulating film 19 is formed. The insulating film formed by the oxidization of the silicon layer and the above-mentioned insulating layers 15, 16 and 17 are designated by numeral 19 collectively. The flat island region 20 is thus formed.

Figure 6E:
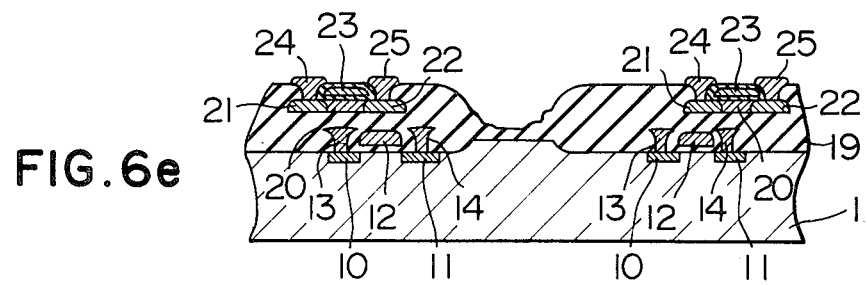

The source region 21, the drain region 22, the gate insulating film, the gate electrode 23, the source 24 and the drain 25 of the MOS transistor are formed on the island region 20 by an ordinary fabrication techniques for semiconductor integrated circuits. A second-layer semiconductor element is thus formed as shown in FIG. 6e thereby to produce a multilayer-type integrated circuitry. The wiring of the semiconductor elements of the first and second layers may be effected either by wirebonding the pads provided on the periphery of the chips or by connecting the first and second layers directly to each other.

The yield of the MOS diodes providing second-layer semiconductor elements thus obtained is very high. According to the present invention, the seeded beam annealing process having the grapho-epitaxy effect and the repetitive growth from the seed crystal with short cycles for each scribe line provide a high-quality crystallized layer. Further, most of the non-active regions are insulated by oxidization and the small defective portions still remaining are removed considerably, thus contributing to the high yield.

In forming still another layer semiconductor element, it is of course possible that the portion corresponding to the scribe line in FIG. 6d is left and used again as a seed crystal for the next layer.

Figure 8:
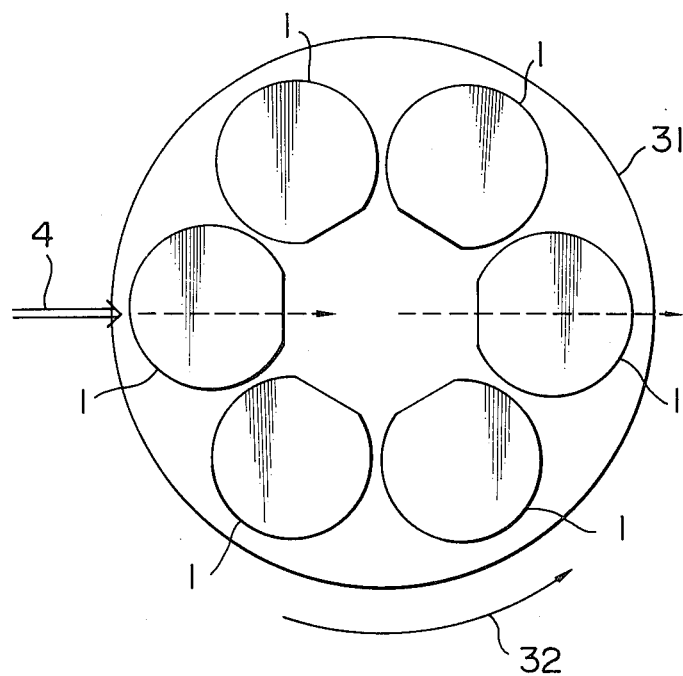
FIG. 8 is a schematic diagram showing a plurality of semiconductor substrates on a base on which a spiral energy beam is irradiated.

The center of the spiral of the energy beam 4 may alternatively be positioned outside of the semiconductor substrate 1. In still another case, the method shown in FIG. 8 is used. Specifically, as shown in FIG. 8, a plurality of semiconductor substrates 1 are fixed on a support base 31, and the energy beam 4 is moved in the direction of the straight arrow while rotating the base 31 in the direction of curved arrow 32, with the result that the beam is spirally radiated efficiently over the whole surface of the semiconductor substrate 1, thus attaining the single crystallization efficiently.

It will be understood from the foregoing description that according to the present invention there is provided a method of fabricating a multilayer-type semiconductor device which is a type of three-dimensional integrated circuit at high speed with high density.

What is claimed is:

1. A method of fabricating a multilayer-type semiconductor device comprising the steps of:
   forming a first-layer semiconductor element on the surface of a semiconductor substrate;
   forming at least one rectangular opening in an insulating film located on a scribe line of said semiconductor substrate to expose said semiconductor substrate through said opening, depositing a polycrystal semiconductor film on said insulating film and the semiconductor substrate exposed through said opening;
   irradiating an energy beam on said polycrystal semiconductor film spirally relative to said semiconductor substrate, in such a manner that said beam passes said at least one opening during one revolution, thereby to crystallize said polycrystal semiconductor film, the diameter of the irradiated energy beam being larger than the maximum length of the opening, the semiconductor substrate exposed through said opening serving to provide a seed crystal for crystallization of said polycrystal semiconductor film; and
   forming a second-layer semiconductor element on said crystallized layer.

2. A method of fabricating a multilayer-type semiconductor device according to claim 1, wherein said insulating film has a first layer and a second layer, a first rectangular opening having a longitudinal axis is formed in a first insulating film, a second insulating film is formed on the first insulating film, and a second rectangular opening having a longitudinal axis substantially perpendicular to the longitudinal axis of said first rectangular opening is formed in the second insulating film so as to be superimposed on the first rectangular opening of said first insulating film, thereby forming said opening from the superimposed portions of said first and second rectangular openings.

3. A method of fabricating a multilayer-type semiconductor device according to claim 1, wherein said step of forming a polycrystal semiconductor includes the process of heat tratment from 700° to 900° C. after depositing said polycrystal semiconductor film.

4. A method of fabricating a multilayer-type semiconductor device according to claim 1, wherein a plurality of openings are formed on the scribe line at pitches of not more than one half of the diameter of the energy beam irradiated on the scribe line between the intersections of adjacent two scribe lines.

5. A method of fabricating a multilayer-type semiconductor device according to claim 2, wherein said insulating film includes a silicon nitride film layer and a silicon oxide film layer.

6. A method according to claim 1, wherein said semiconductor substrate is made of a silicon single crystal, and said polycrystal semiconductor is made of a polycrystal silicon.

7. A method according to claim 1, wherein said crystallized layer is made of a silicon single crystal.

8. A method according to claim 1, wherein an insulating film is selectively formed on the crystallized layer.

9. A method according to claim 1, wherein said semiconductor element is a MOS transistor.

10. A method of fabricating a multilayer-type semiconductor device comprising the steps of:

forming a first-layer semiconductor element on the surface of each of a plurality of semiconductor substrates disposed on a supporting base;

forming at least one rectangular opening in an insulating film located on a scribe line of said semiconductor substrate to expose said semiconductor substrate through said opening;

depositing a polycrystal semiconductor film on said insulating film and the semiconductor substrate exposed through said opening;

irradiating an energy beam on said polycrystal semiconductor film spirally relative to said semiconductor substrate, in such a manner that said beam passes said at least one opening during one revolution, thereby to crystallize said polycrystal semiconductor film, the diameter of the irradiated energy beam being larger than the maximum length of the opening, the semiconductor substrate exposed through said opening serving to provide a seed crystal for crystallization of said polycrystal semiconductor film; and forming a second-layer semi-conductor element on said crystallized layer.

* * * * *